(12) United States Patent
Ito et al.

(10) Patent No.: US 6,989,587 B2
(45) Date of Patent: Jan. 24, 2006

(54) SEMICONDUCTOR DEVICE AND MANUFACTURING THE SAME

(75) Inventors: Mamoru Ito, Tamamura (JP); Akira Muto, Haruna (JP); Tomio Yamada, Tamamura (JP); Tsuneo Endoh, Komoro (JP); Satoru Konishi, Saku (JP); Kazuaki Uehara, Saku (JP); Tsutomu Ida, Komoro (JP); Koji Odaira, Takasaki (JP); Hirokazu Nakajima, Saku (JP)

(73) Assignees: Renesas Technology Corp., Tokyo (JP); Renesas Esatern Japan Semiconductor, Inc., Tokyo (JP)

( * ) Notice: Subject to any disclaimer, the term of this patent is extended or adjusted under 35 U.S.C. 154(b) by 37 days.

(21) Appl. No.: 10/730,119

(22) Filed: Dec. 9, 2003

(65) Prior Publication Data

US 2004/0113248 A1 Jun. 17, 2004

(30) Foreign Application Priority Data

Dec. 17, 2002 (JP) ........................... 2002-364686

(51) Int. Cl.
*H91L 23/02* (2006.01)

(52) U.S. Cl. ........................ 257/678; 257/706
(58) Field of Classification Search ............... 257/678, 257/700–707, 717–720, 727–731, 734–738, 257/777, 779, 780, 781, 784, 785, 787, 791
See application file for complete search history.

(56) References Cited

U.S. PATENT DOCUMENTS

| | | | | |
|---|---|---|---|---|
| 4,758,927 A | * | 7/1988 | Berg | 361/401 |
| 4,888,307 A | * | 12/1989 | Spairrisano et al. | 438/106 |
| 5,907,474 A | * | 5/1999 | Dolbear | 361/705 |
| 5,949,649 A | * | 9/1999 | Bartlow | 361/704 |
| 6,703,261 B2 | * | 3/2004 | Ito | 438/122 |
| 6,847,112 B2 | * | 1/2005 | Ito | 257/712 |

FOREIGN PATENT DOCUMENTS

| | | |
|---|---|---|
| JP | 11-330859 | 11/1999 |
| JP | 2002-349218 | 12/2000 |
| JP | 2002-76158 | 3/2002 |

* cited by examiner

*Primary Examiner*—David Nhu
(74) *Attorney, Agent, or Firm*—Mattingly, Stanger & Malur

(57) ABSTRACT

There is provided a semiconductor device with enhanced reliability having a heat sink mounting a plurality of semiconductor chips, a plurality of inner leads connected electrically to the semiconductor chips, a molding body for resin molding the plurality of semiconductor chips and the plurality of inner leads, a plurality of wires for providing electrical connections between the respective electrodes of the semiconductor chips and the inner leads corresponding thereto, and wide outer leads connecting to the inner leads and exposed outside the molding body. A plurality of slits are formed in the respective portions of the outer leads located outside the molding body to extend lengthwise in directions in which the outer leads are extracted. This achieves a reduction in lead stress which is placed on the outer leads by thermal stress or the like after the mounting of a MOSFET and thereby enhances the reliability of the MOSFET.

16 Claims, 18 Drawing Sheets

1a: INNER LEAD
2: FET CHIP
4: WIRE (METAL WIRE)
5: HEAT SINK (METAL PLATE)
5c: DEPRESSED PORTION
7: MOS-C CHIP

1b: OUTER LEAD
1c: SLIT
1d: BENT PORTION
1e: METAL PLATE SUSPENDING PORTION
1f: OUTER-LEAD SPLIT PORTION
3: MOLDING BODY
6: MOSFET (SEMICONDUCTOR DEVICE)

1a: INNER LEAD
2: FET CHIP
4: WIRE (METAL WIRE)
5: HEAT SINK (METAL PLATE)
5c: DEPRESSED PORTION
7: MOS-C CHIP

SEMICONDUCTOR DEVICE AND MANUFACTURING THE SAME

BACKGROUND OF THE INVENTION

The present invention relates to semiconductor manufacturing technologies and, more particularly, to a technology which is effective when applied to a semiconductor device with a high-output semiconductor chip incorporate therein and a manufacturing method therefor.

In a conventional high-power consuming semiconductor device of resin-molded type, slit-like bored portions are formed in a heat dissipation plate extending from an island, which is a semiconductor device mounting portion in a mold resin, to the outside of the mold resin, and the mold resin is disposed in the bored portions (see, e.g., Patent Document 1).

In another semiconductor device having wide leads connected electrically by bonding wires to a high-power semiconductor chip mounted on a heat dissipation plate, two bored portions are provided in each of the wide leads in such a manner that one of the two bored portions is buried in the peripheral wall of a resin, while the other bored portion is provided outside the peripheral wall of the resin (see, e.g., Patent Document 2).

There is also a semiconductor device in which a plurality of bores are provided in wide leads for heat dissipation to be located along the edges of a mold resin (see, e.g., Patent Document 3).

[Patent Document 1]
Japanese Unexamined Patent Publication No. 2000-349218 (p.4, FIG. 2)

[Patent Document 2]
Japanese Unexamined Patent Publication No. 2002-76158 (p.7, FIG. 6)

[Patent Document 3]
Japanese Unexamined Patent Publication No. Hei 11(1999)-330859 (p.4, FIG. 2)

SUMMARY OF THE INVENTION

In a semiconductor device having a high-output semiconductor chip operating at a high frequency, it is effective to use wide leads. However, problems arise in association with the retention of a sufficient electrode capacitance and lead stress.

To solve the problems, the present inventor has examined a ceramic package with a ceramic plate incorporated therein as effective means in solving the problems associated with the retention of a sufficient electrode capacitance and lead stress. However, the leads should be connected to the ceramic plate by silver brazing, which requires labor and time. In addition, a heat sink high in material cost should also be used so that high package cost presents a problem.

Moreover, a ceramic package requires a sealing test and a foreign substance test so that package assembly cost is increased disadvantageously.

Since each of the bores provided in the leads is extending between the inside and outside of the mold resin in the structure shown in each of Patent Documents 1 and 3 mentioned above, a resin for molding flows in a part of each of the bores located outside a molding body so that resin flakes fall off after the assembly of a package to exert adverse effects during the mounting of the package.

It is therefore an object of the present invention to provide a semiconductor device and a method for manufacturing the same with reduced lead stress and enhanced reliability.

Another object of the present invention is provide a semiconductor device and a method for manufacturing the same with a sufficient electrode capacitance Still another object of the present invention is to provide a semiconductor device and a method for manufacturing the same at lower cost.

Yet another object of the present invention is to provide a semiconductor device and a method for manufacturing the same in which the occurrence of a resin burr is reduced.

The above and other objects and novel features of the present invention will become apparent from the description of the present specification and the accompanying drawings.

A brief description will be given to the outline of the representative aspects of the present invention disclosed in the present application.

Specifically, one aspect of the present invention is a semiconductor device comprising: a metal plate for mounting a semiconductor chip; a plurality of leads connected electrically to the semiconductor chip; and a molding body for molding the semiconductor chip and a part of each of the plurality of leads, wherein a slit, extending lengthwise in a direction in which the lead is extracted, is formed in each of the leads located outside the molding body to.

Another aspect of the present invention is a method for manufacturing a semiconductor device comprising a metal plate for mounting a semiconductor chip, a plurality of leads connected electrically to the semiconductor chip, and a molding body for molding the semiconductor chip and a part of each of the plurality of leads, a slit being formed in a portion of each of the plurality of leads located outside the molding body to extend lengthwise in a direction in which the lead is extracted, the method comprising the step of: performing a screening test on the semiconductor device, wherein the slit is formed at least prior to the screening test.

DESCRIPTION OF THE PREFERRED EMBODIMENTS

Figure 1:
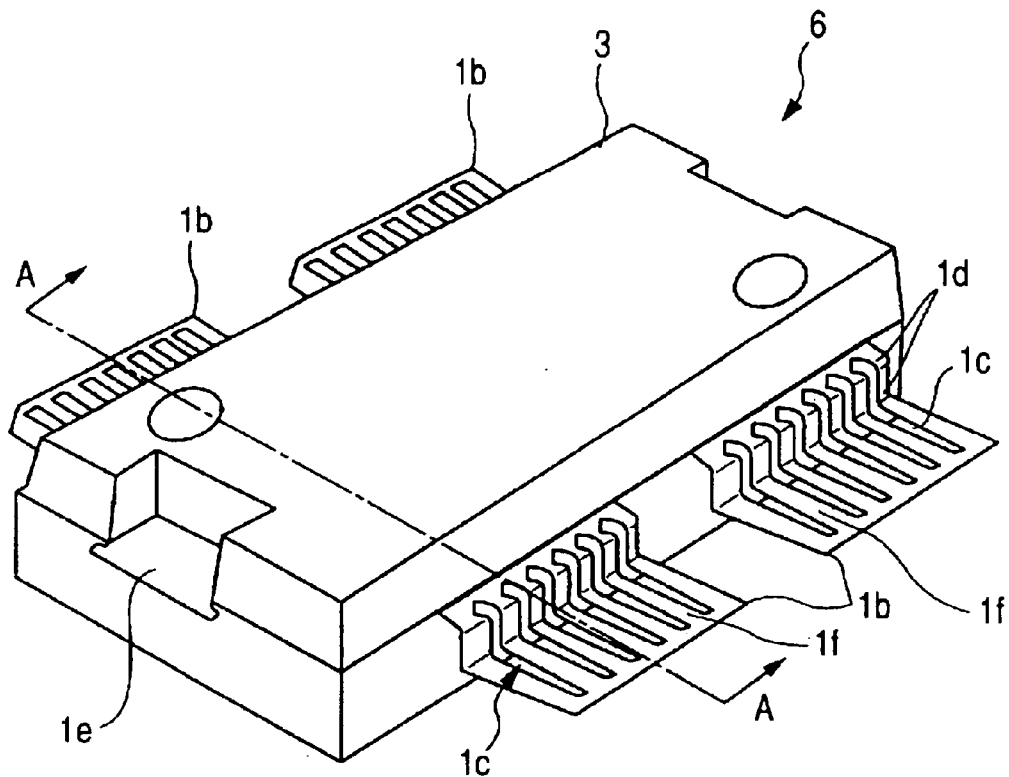
FIG. 1 is a perspective view showing an example of a structure of a semiconductor device according to an embodiment of the present invention.

Referring to the drawings, the embodiments of the present invention will be described herein below in detail. Throughout the drawings for illustrating the individual embodiment, members having like functions are designated by like reference numerals and the repeated description thereof will be omitted.

Figure 2:
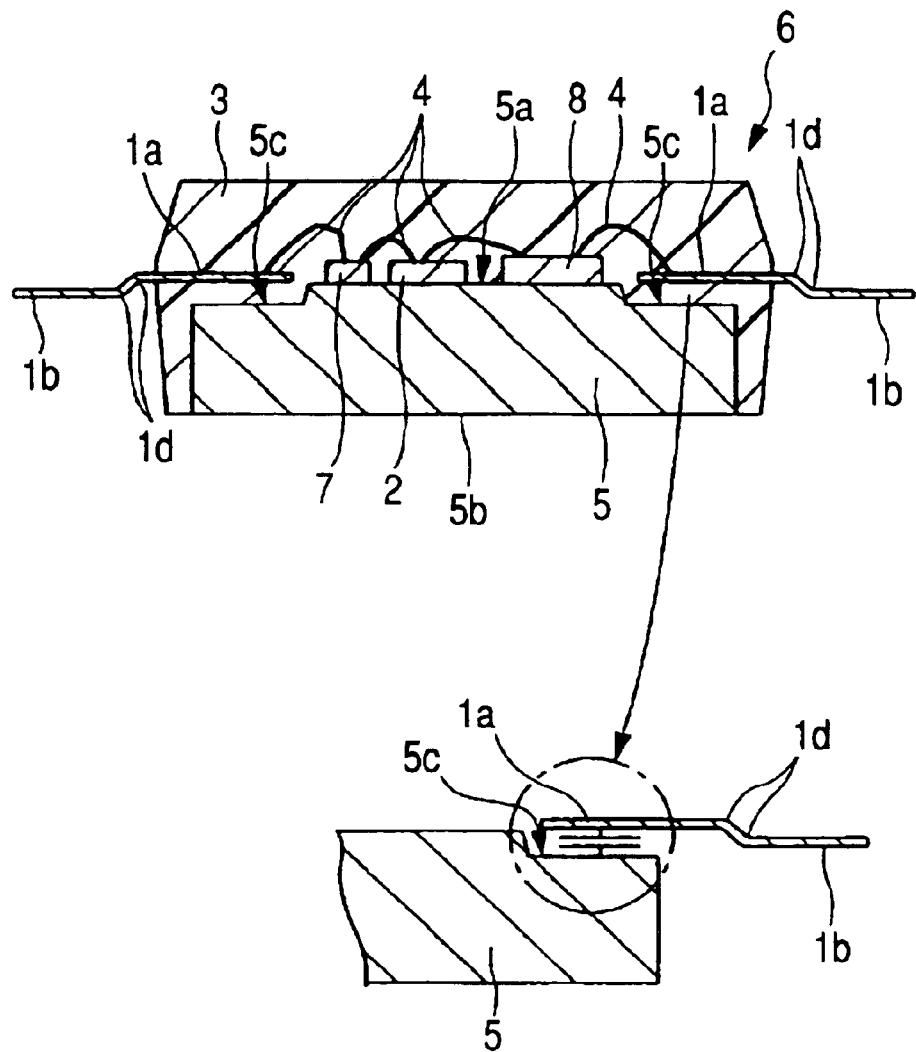
FIG. 2 is a cross-sectional view taken along the line A—A of FIG. 1, which includes a partially enlarged cross-sectional view showing the formation of an electrostatic capacitance.
Figure 3:
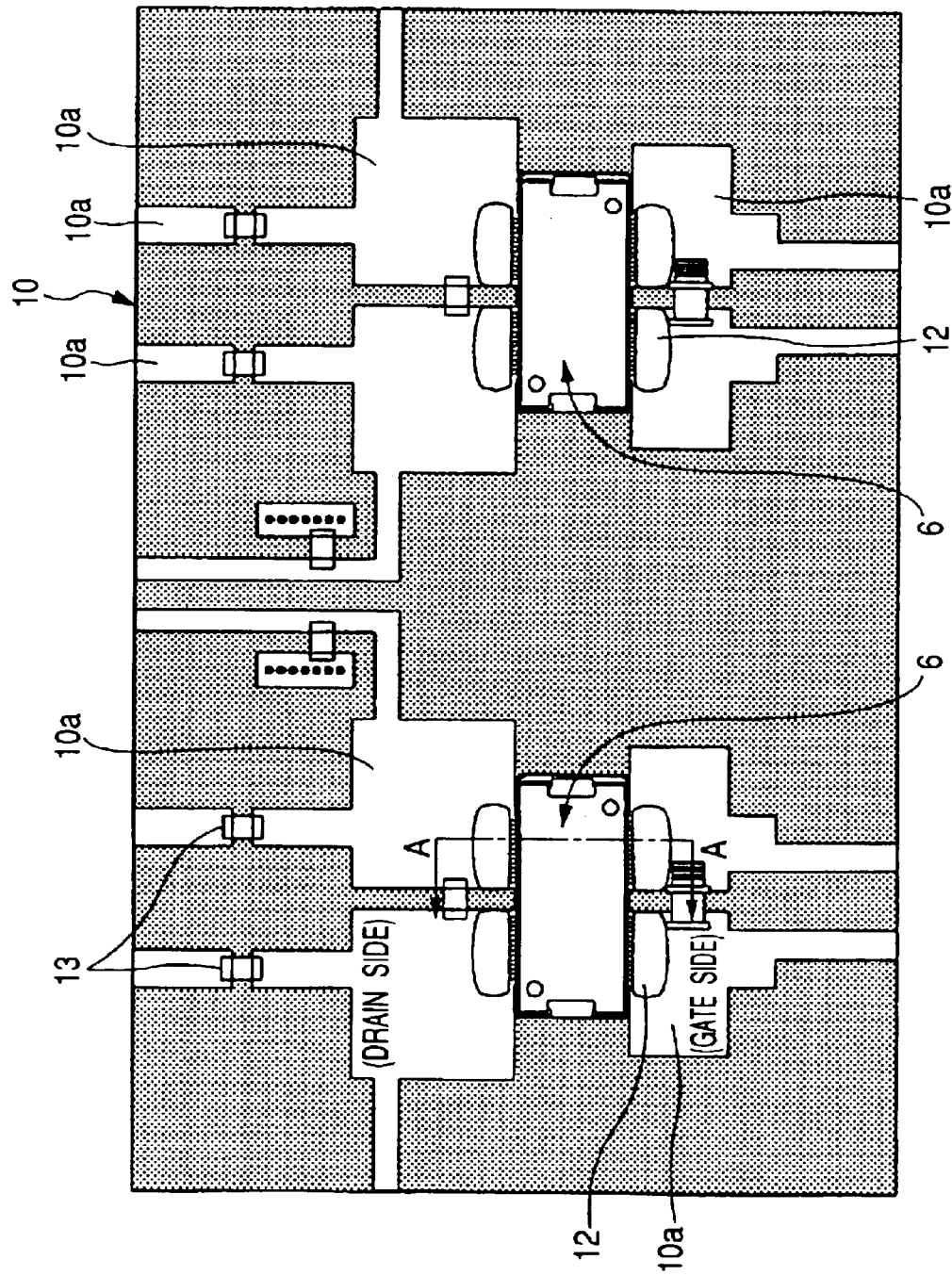
FIG. 3 is a plan view showing an example of the state of the semiconductor device shown in FIG. 1 which is mounted on a substrate.
Figure 4:
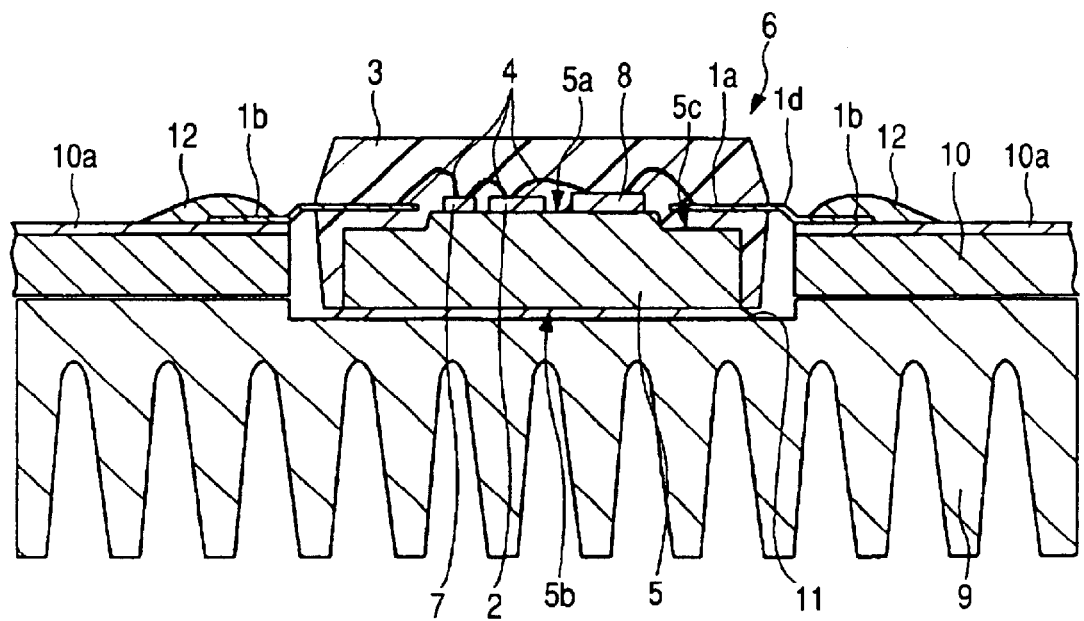
FIG. 4 is a partially enlarged cross-sectional view showing a cross-sectional structure taken along the line A—A of FIG. 3 in enlarged relation.
Figure 5:
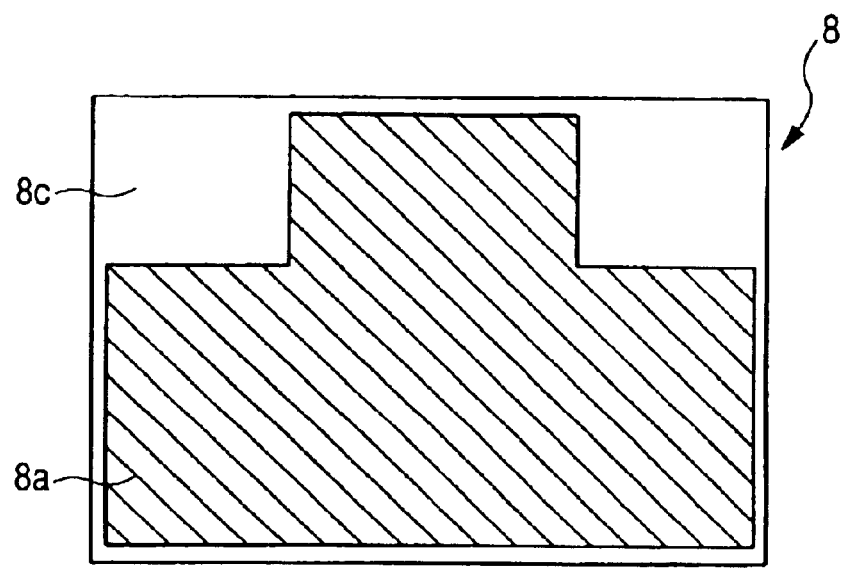
FIG. 5 is a plan view showing an example of a structure of a transmission line substrate to be mounted on the semiconductor device shown in FIG. 1.
Figure 6:
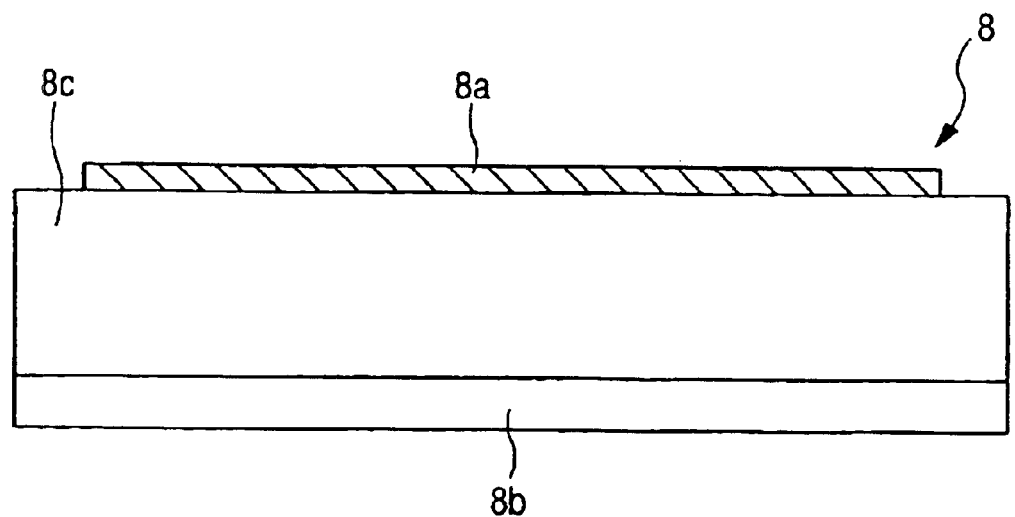
FIG. 6 is a side view showing the structure of the transmission line substrate shown in FIG. 5.
Figure 7:
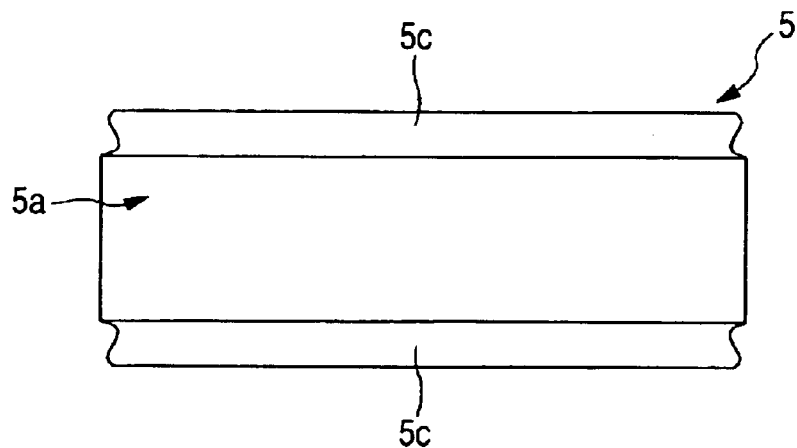
FIG. 7 is a plan view showing an example of a structure of a heat sink used for the assembly of the semiconductor device shown in FIG. 1.
Figure 8:
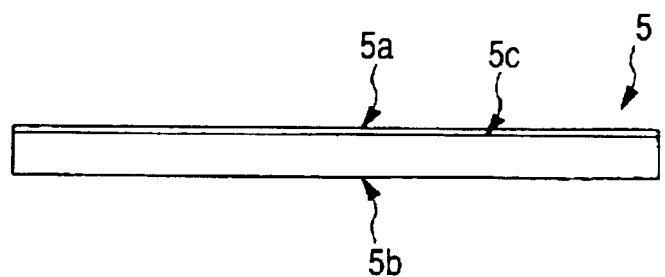
FIG. 8 is a side view of a lengthwise structure of the heat sink shown in FIG. 7.
Figure 9:
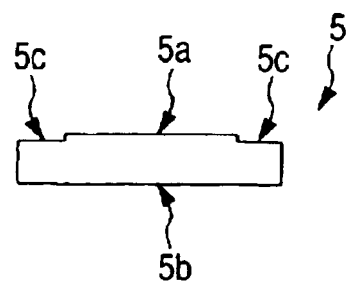
FIG. 9 is a side view of a widthwise structure of the heat sink shown in FIG. 7.
Figure 10:
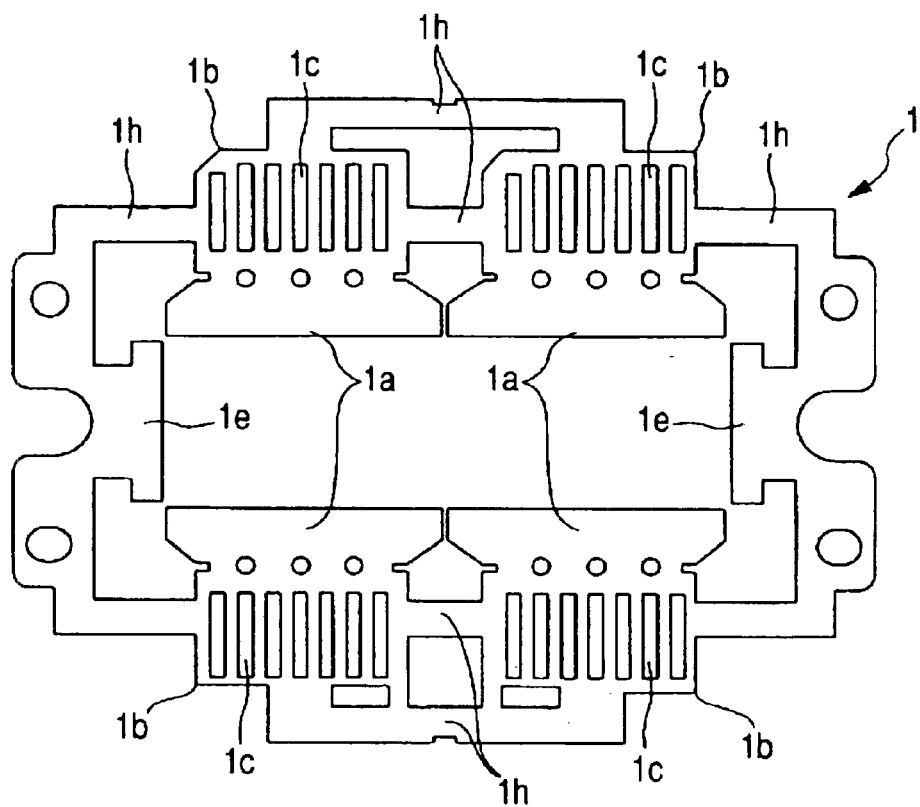
FIG. 10 is a plan view showing an example of a structure of a lead frame used for the assembly of the semiconductor device shown in FIG. 1.
Figure 11:
FIG. 11 is a side view showing a lengthwise structure of the lead frame shown in FIG. 10.
Figure 12:
FIG. 12 is a side view showing a widthwise structure of the lead frame shown in FIG. 10.
Figure 13:
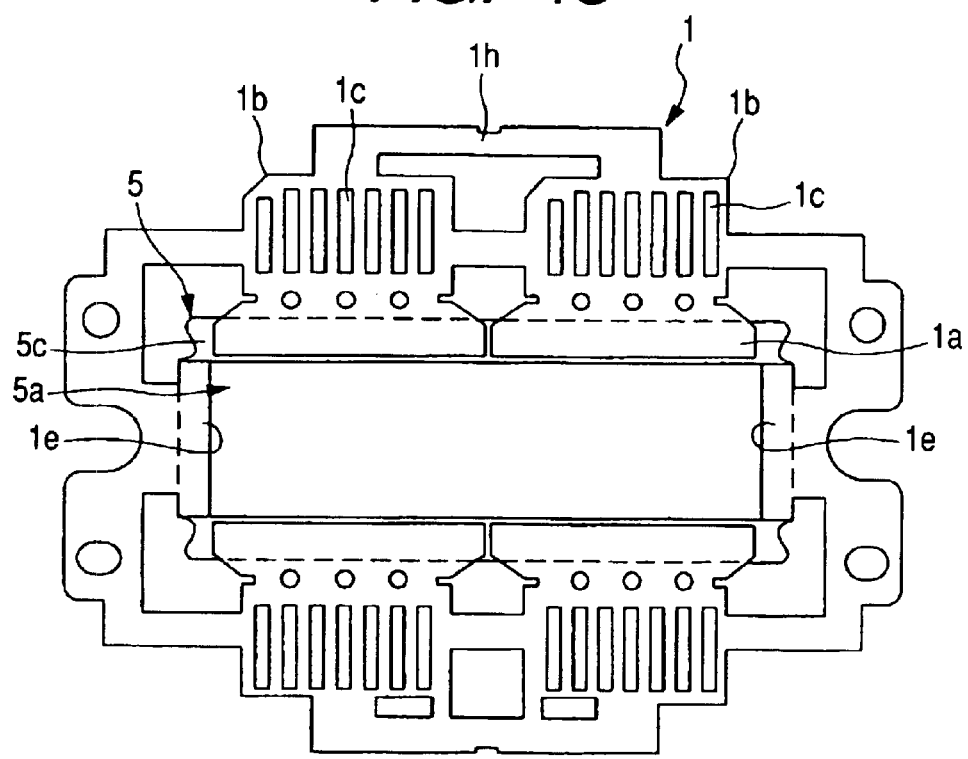
FIG. 13 is a plan view showing an example of a stem structure obtained by bonding the lead frame to the heat sink in the assembly of the semiconductor device shown in FIG. 1.
Figure 14:
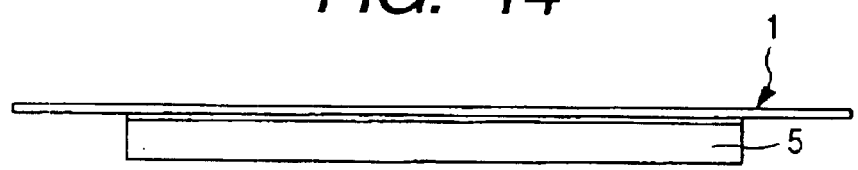
FIG. 14 is a side view showing a lengthwise structure of the stem structure shown in FIG. 13.
Figure 15:
FIG. 15 is a side view showing a widthwise structure of the stem structure shown in FIG. 13.
Figure 16:
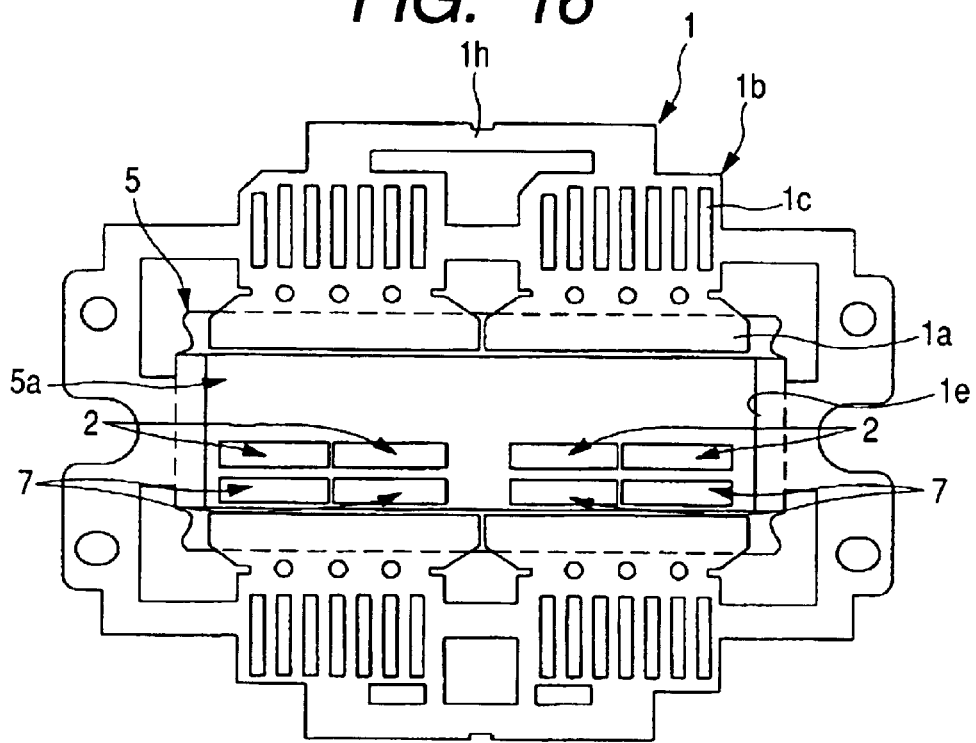
FIG. 16 is a plan view showing an example of a structure after die bonding in the assembly of the semiconductor device shown in FIG. 1.
Figure 17:
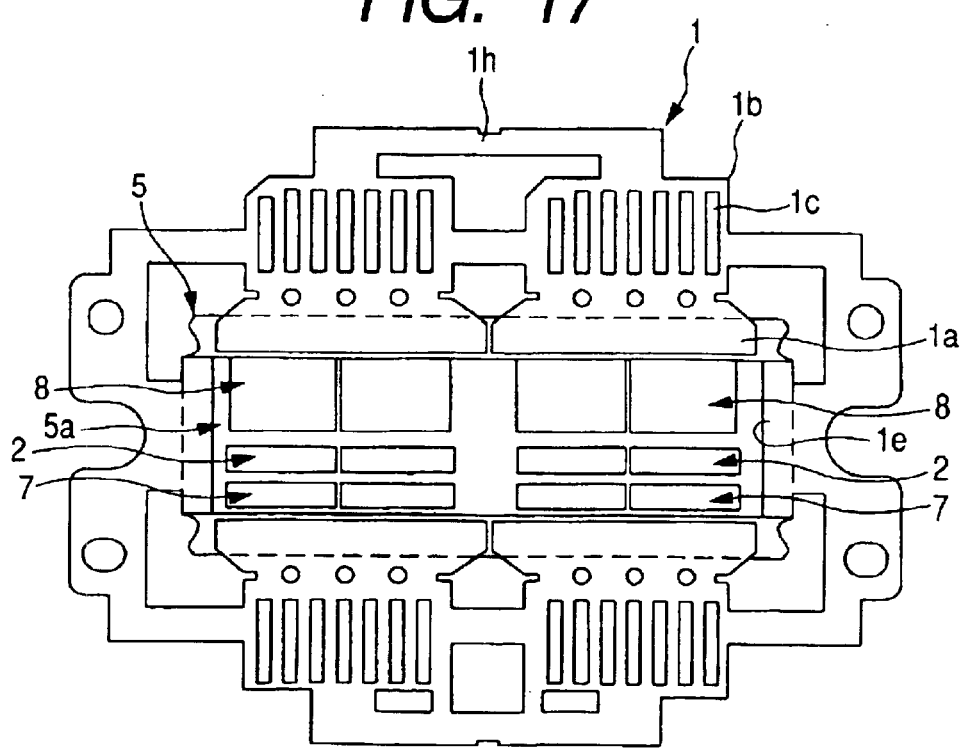
FIG. 17 is a plan view showing an example of a structure after the mounting of the transmission line substrate in the assembly of the semiconductor device shown in FIG. 1.
Figure 18:
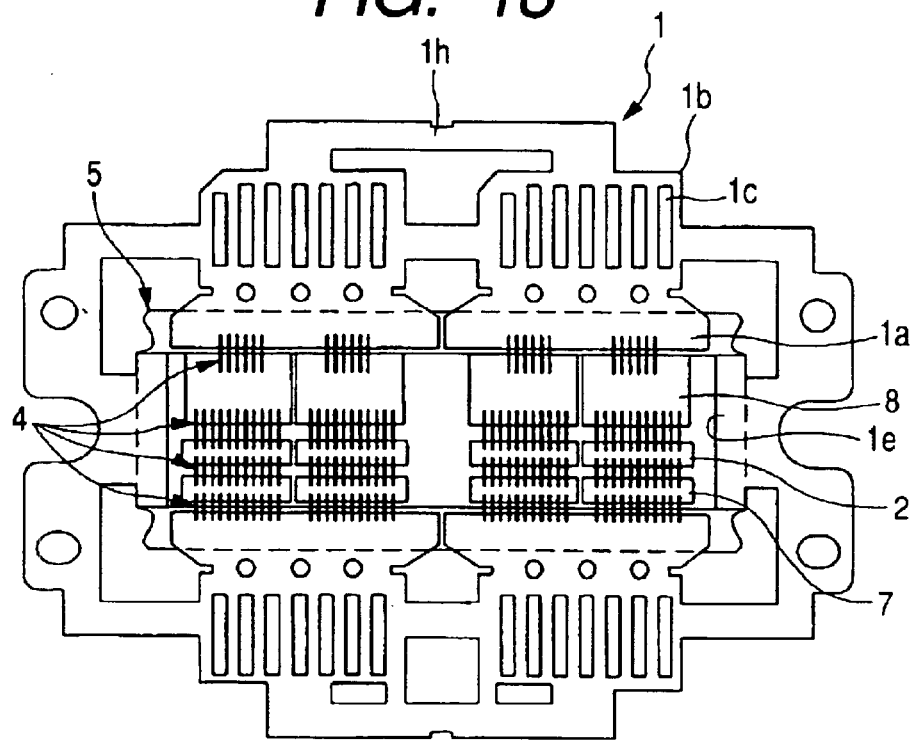
FIG. 18 is a plan view showing an example of a structure after wire bonding in the assembly of the semiconductor device shown in FIG. 1.
Figure 19:
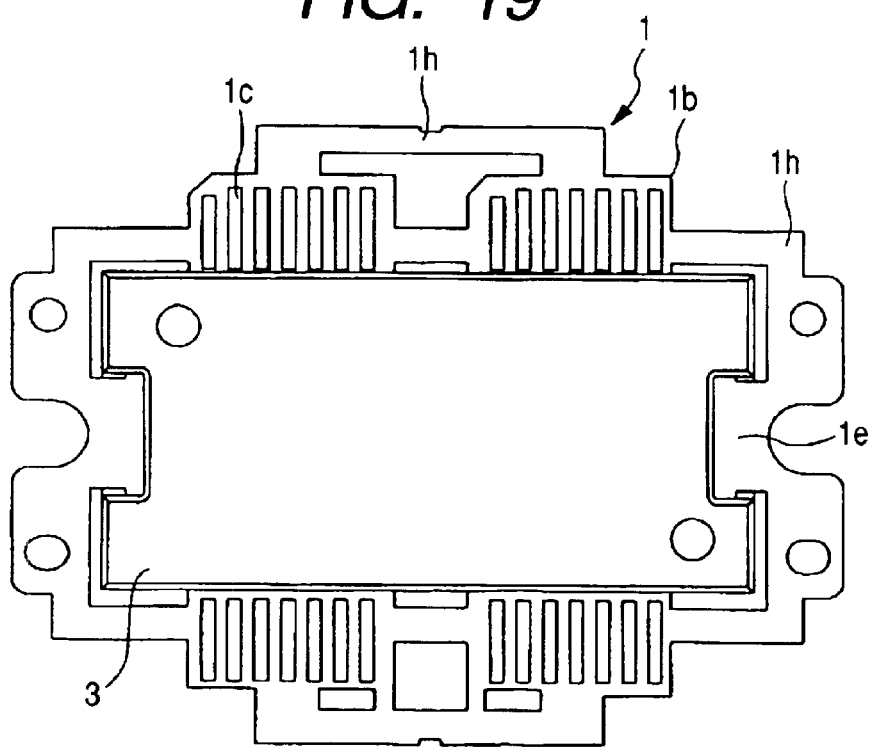
FIG. 19 is a plan view showing an example of a structure after resin molding in the assembly of the semiconductor device shown in FIG. 1.
Figure 20:
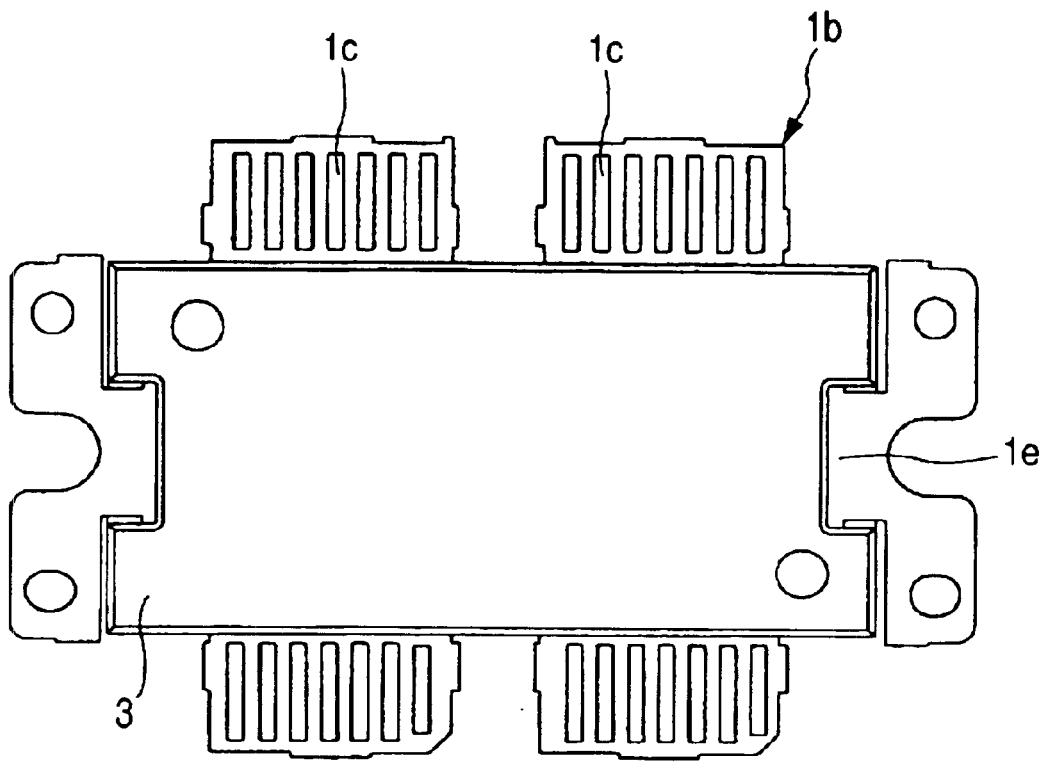
FIG. 20 is a plan view showing an example of a structure after lead cutting in the assembly of the semiconductor device shown in FIG. 1.
Figure 21:
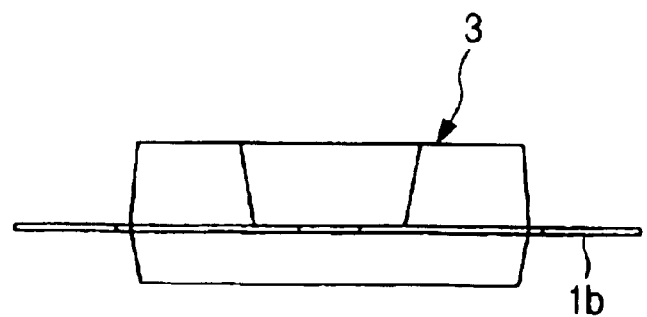
FIG. 21 is a side view of the structure shown in FIG. 20.
Figure 22:
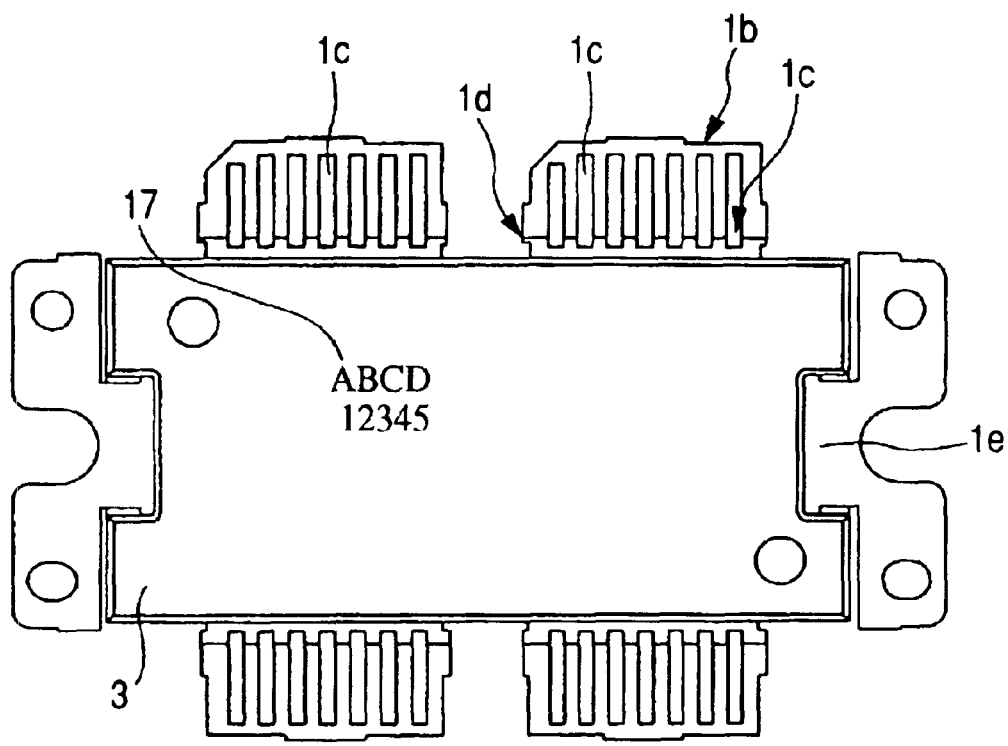
FIG. 22 is a plan view showing an example of a structure after lead molding in the assembly of the semiconductor device shown in FIG. 1.
Figure 23:
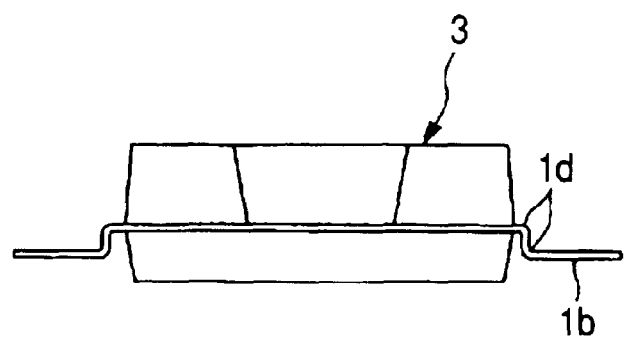
FIG. 23 is a side view of the structure shown in FIG. 22.
Figure 24:
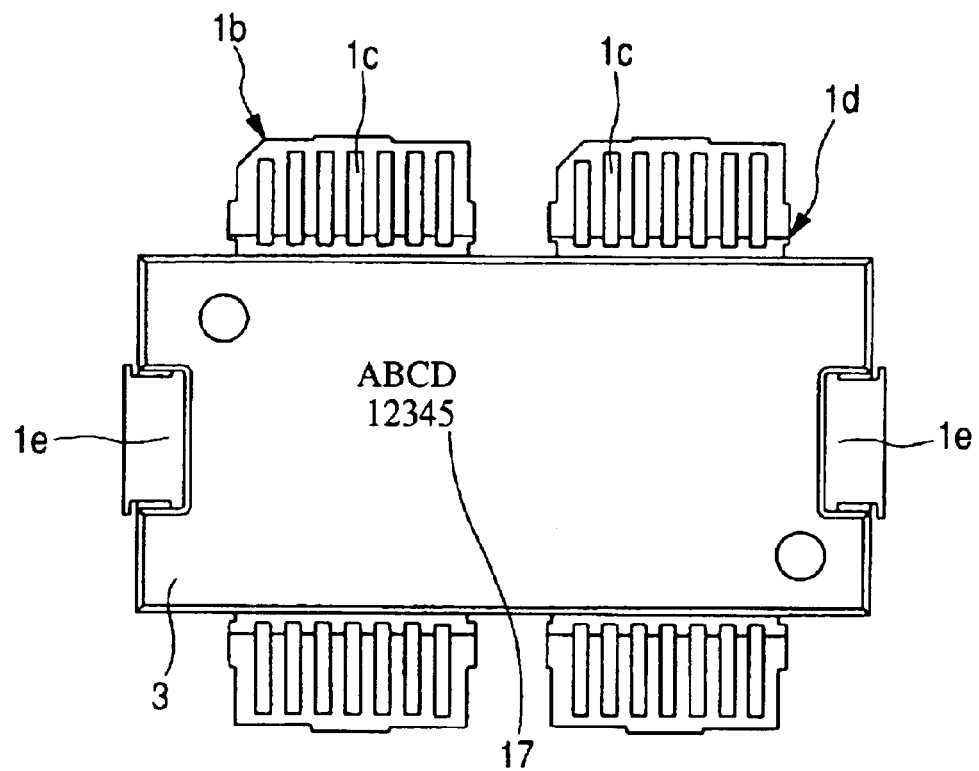
FIG. 24 is a plan view showing an example of a structure after the cutting of metal plate suspending portions in the assembly of the semiconductor device shown in FIG. 1.
Figure 25:
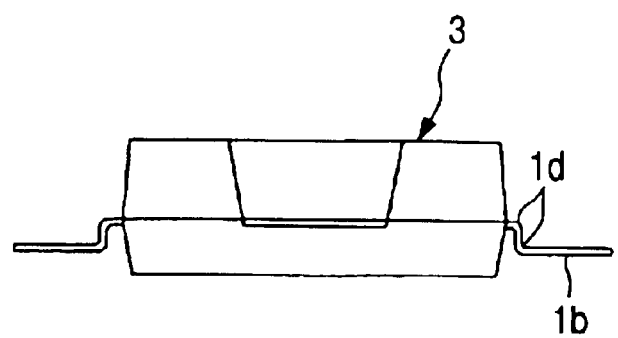
FIG. 25 is a side view of the structure shown in FIG. 24.
Figure 26:
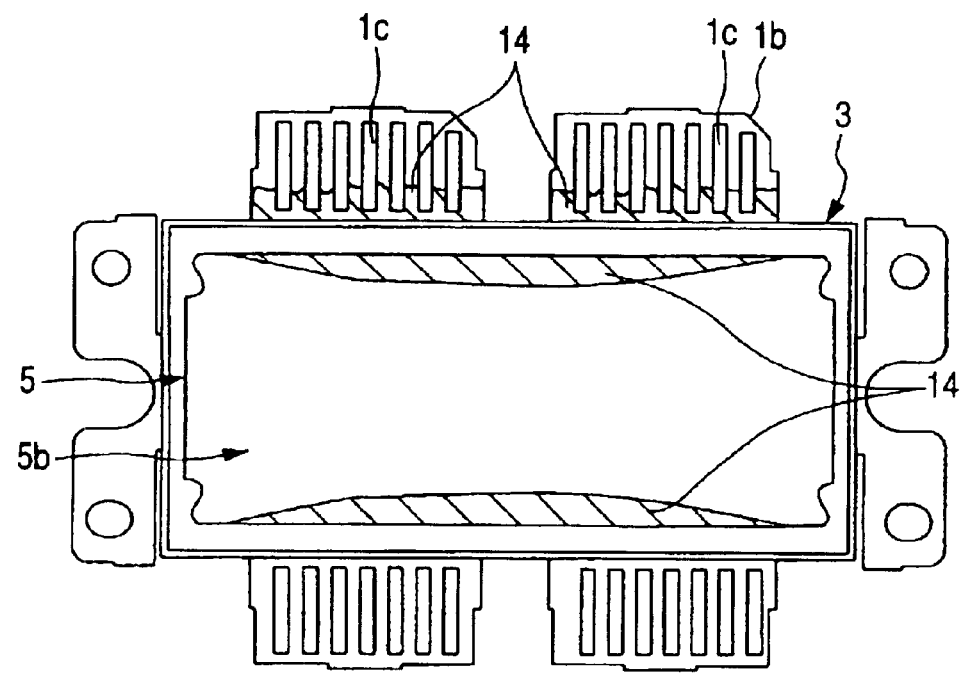
FIG. 26 is a plan view showing the states of adhesion of a resin burr caused by resin molding in the assembly of a semiconductor device in a comparative example.
Figure 27:
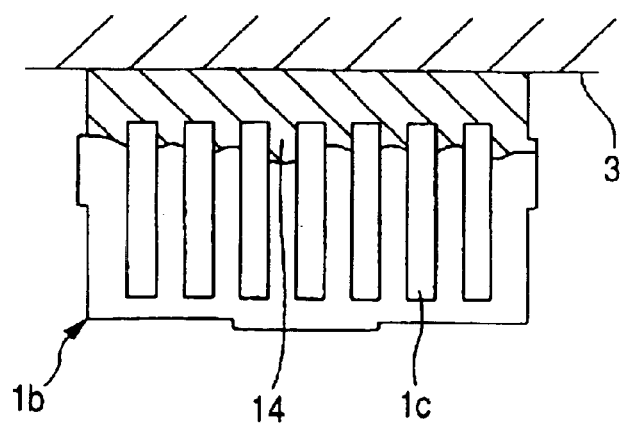
FIG. 27 is a partially enlarged plan view showing the states of adhesion of the resin burr shown in FIG. 26 to the surfaces of leads.
Figure 28:
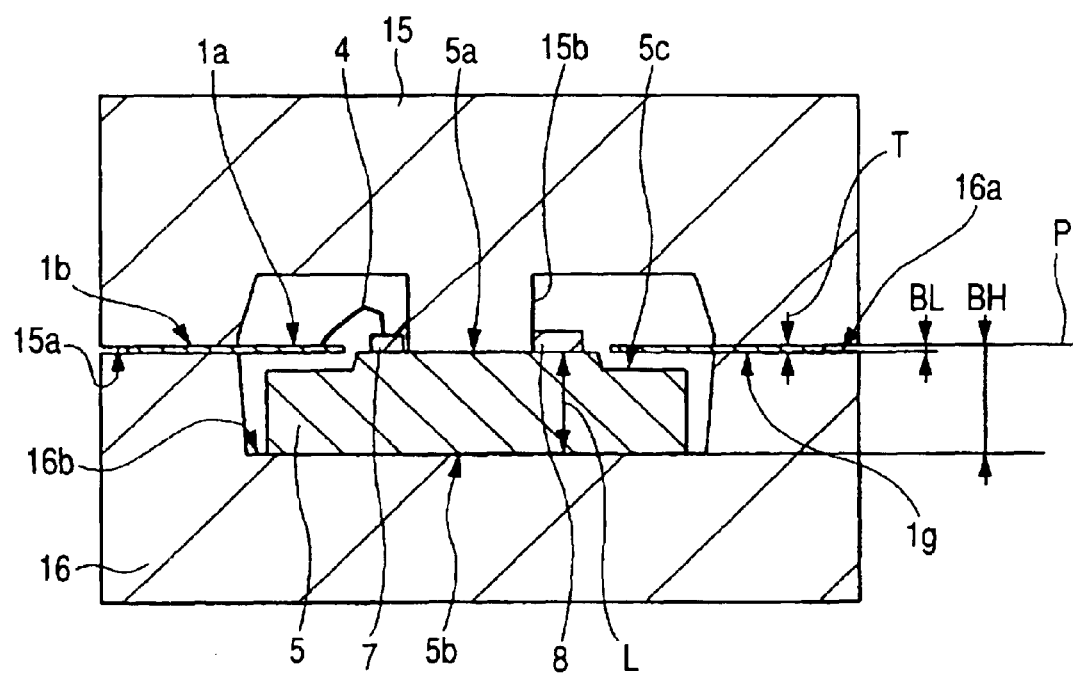
FIG. 28 is a cross-sectional view showing an example of a die clamped structure during resin molding in the assembly of the semiconductor device shown in FIG. 1.
Figure 29:
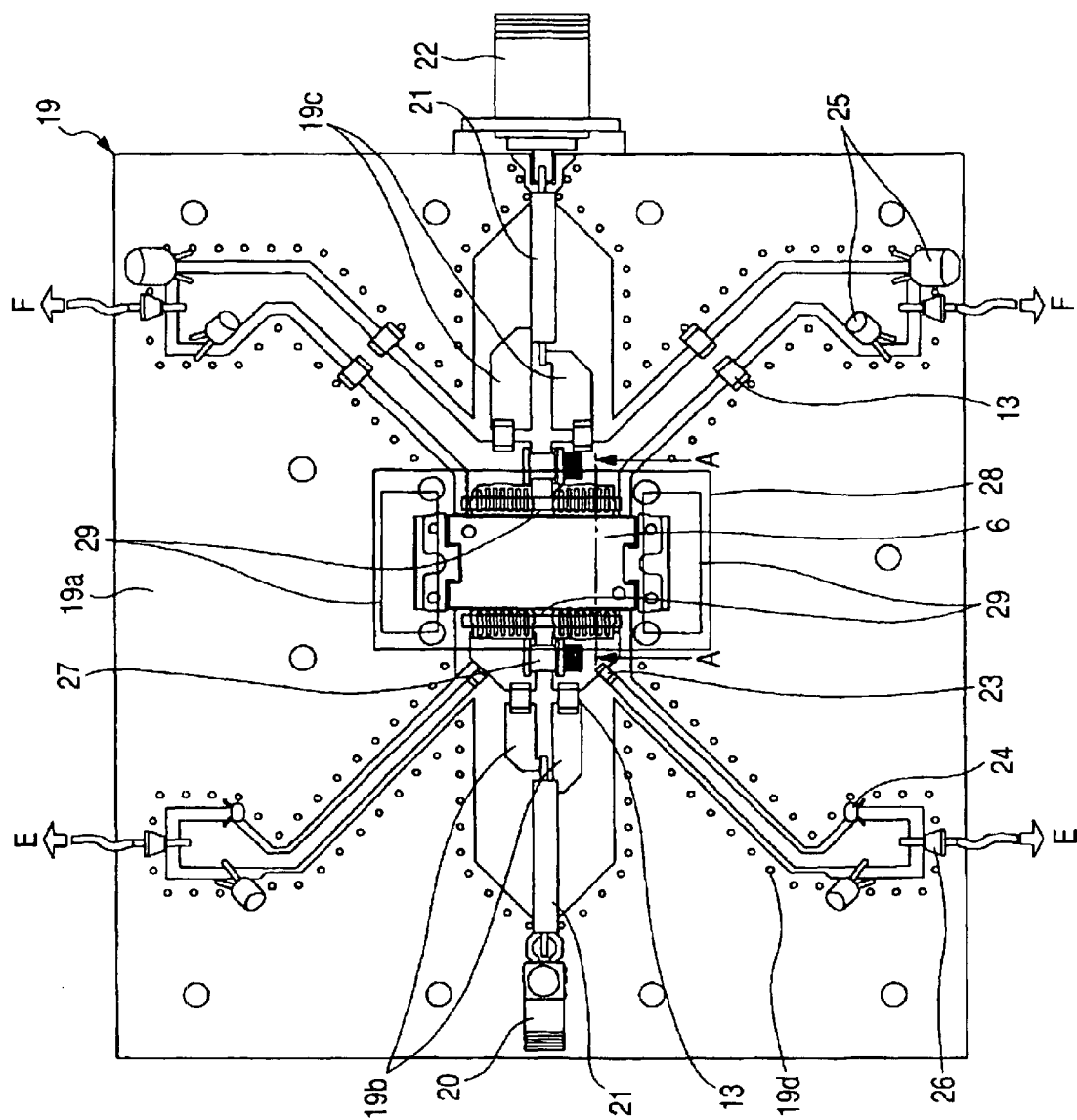
FIG. 29 is a plan view showing an example of a structure in a screening state in the assembly of the semiconductor device shown in FIG. 1.
Figure 30:
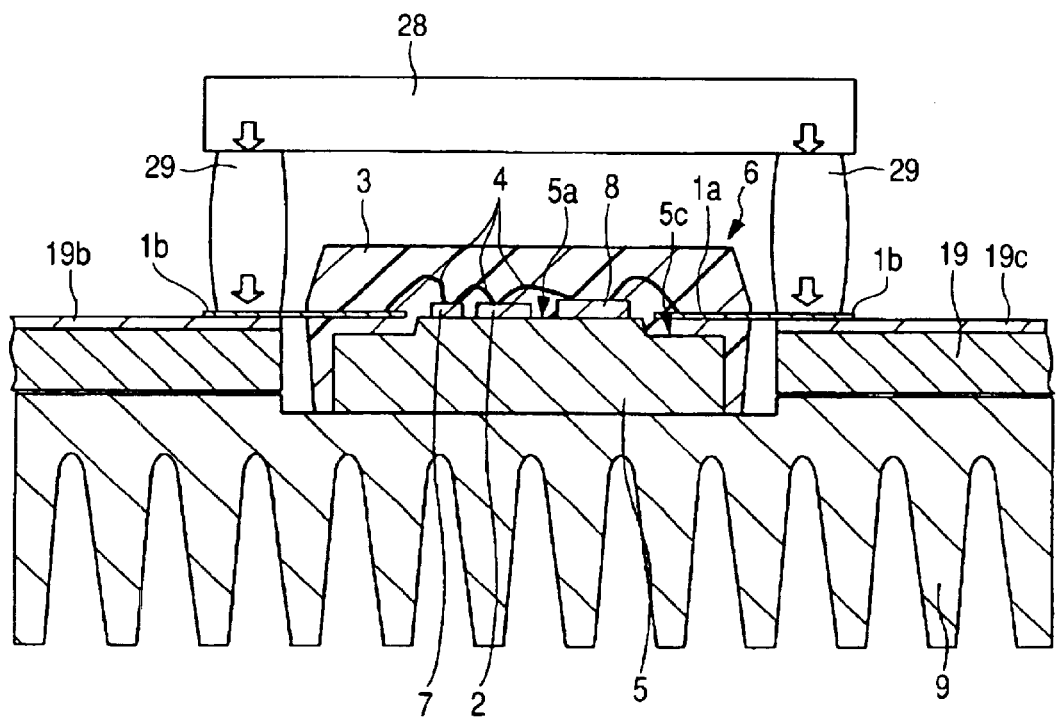
FIG. 30 is a partially enlarged cross-sectional view showing a cross-sectional structure taken along the line A—A of FIG. 29.
Figure 31:
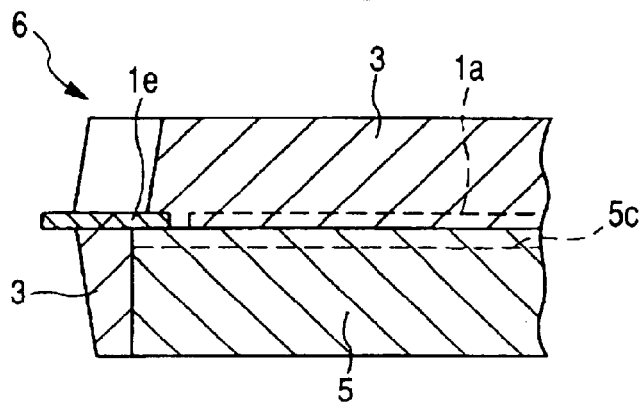
FIG. 31 is a partial cross-sectional view showing a relationship between an inner lead and the height of the metal plate suspending portion in the semiconductor device shown in FIG. 1.
Figure 32:
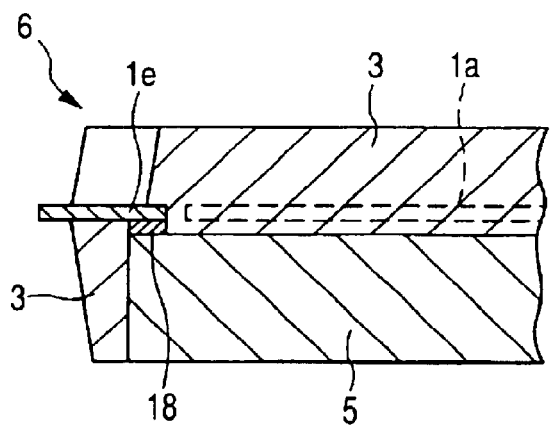
FIG. 32 is a partial cross-sectional view showing a relationship between the inner lead and the height of the metal plate suspending portion in a semiconductor device according to a variation of the present invention.
Figure 33:
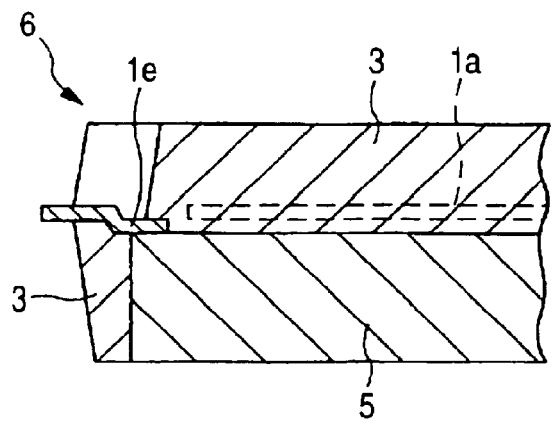
FIG. 33 is a partial cross-sectional view showing a relationship between the inner lead and the height of the metal plate suspending portion in a semiconductor device according to another variation of the present invention.

FIG. 1 is a perspective view showing an example of a structure of a semiconductor device according to an embodiment of the present invention. FIG. 2 is a cross-sectional view taken along the line A—A of FIG. 1, which includes a partially enlarged cross-sectional view showing the formation of an electrostatic capacitance. FIG. 3 is a plan view showing an example of the state of the semiconductor device shown in FIG. 1 which is mounted on a substrate. FIG. 4 is a partially enlarged cross-sectional view showing a cross-sectional structure taken along the line A—A of FIG. 3 in enlarged relation. FIG. 5 is a plan view showing an example of a structure of a transmission line substrate to be mounted on the semiconductor device shown in FIG. 1. FIG. 6 is a side view showing the structure of the transmission line substrate shown in FIG. 5. FIG. 7 is a plan view showing an example of a structure of a heat sink used for the assembly of the semiconductor device shown in FIG. 1. FIG. 8 is a side view of a lengthwise structure of the heat sink shown in FIG. 7. FIG. 9 is a side view of a widthwise structure of the heat sink shown in FIG. 7. FIG. 10 is a plan view showing an example of a structure of a lead frame. FIG. 11 is a side view showing a lengthwise structure of the lead frame shown in FIG. 10. FIG. 12 is a side view showing a widthwise structure of the lead frame shown in FIG. 10. FIG. 13 is a plan view showing an example of a stem structure obtained by bonding the lead frame to the heat sink. FIG. 14 is a side view showing a lengthwise structure of the stem structure shown in FIG. 13. FIG. 15 is a side view showing a widthwise structure of the stem structure shown in FIG. 13. FIG. 16 is a plan view showing an example of a structure after die bonding. FIG. 17 is a plan view showing an example of a structure after the mounting of the transmission line substrate. FIG. 18 is a plan view showing an example of a structure after wire bonding. FIG. 19 is a plan view showing an example of a structure after resin molding. FIG. 20 is a plan view showing an example of a structure after lead cutting. FIG. 21 is a side view of the structure shown in FIG. 20. FIG. 22 is a plan view showing an example of a structure after lead molding. FIG. 23 is a side view of the structure shown in FIG. 22. FIG. 24 is a plan view showing an example of a structure after the cutting of metal plate suspending portions. FIG. 25 is a side view of the structure shown in FIG. 24. FIG. 26 is a plan view showing the states of adhesion of a resin burr caused by resin molding in the assembly of a semiconductor device in a comparative example. FIG. 27 is a partially enlarged plan view showing the states of adhesion of the resin burr shown in FIG. 26 to the surfaces of leads. FIG. 28 is a cross-sectional view showing an example of a die clamped structure during resin molding in the assembly of the semiconductor device shown in FIG. 1. FIG. 29 is a plan view showing an example of a structure in a screening state. FIG. 30 is a partially enlarged cross-sectional view showing a cross-sectional structure taken along the line A—A of FIG. 29. FIG. 31 is a partial cross-sectional view showing a relationship between an inner lead and the height of the metal plate suspending portion in the semiconductor device shown in FIG. 1. FIGS. 32 and 33 are partial cross-sectional view each showing a relationship between the inner lead and the height of the metal plate suspending portion in a semiconductor device according to a variation of the present invention.

The semiconductor device according to the present embodiment shown in each of FIGS. 1 and 2 is a resin-molded semiconductor package having a high-output semiconductor chip operating at a high frequency. As an example of the foregoing semiconductor device, a MOSFET (Metal Oxide Semiconductor Field Effect Transistor) 6 will be described herein.

The MOSFET 6 according to the present embodiment is disposed at, e.g., a base station for a mobile phone and used primarily in the band of 0.8 to 2 GHz, while having a high-output semiconductor chip of 30 W (watt) or more mounted thereon. In some cases, however, a high-output characteristic on the level of 250 W is required of the MOSFET 6.

A description will be given to a structure of the MOSFET 6. The MOSFET 6 has: a heat sink 5 which is a metal plate mounting a plurality of semiconductor chips; a plurality of inner leads 1a connected electrically to the semiconductor chips; a molding body 3 for resin molding the plurality of semiconductor chips and the plurality of inner leads 1a; a plurality of wires (metal wires) 4 for providing electrical connections between the respective electrodes of the semiconductor chips and the inner leads 1a corresponding thereto; and wide outer leads 1b connecting to the inner leads 1a and exposed outside the molding body 3. A plurality of slits 1c are formed in the outer leads 1b outside the molding body 3 to extend lengthwise in directions in which the outer leads 1b are extracted.

The slits 1c are for reducing lead stress which is placed by thermal stress or the like on the outer leads 1b after the mounting of the MOSFET 6.

In the MOSFET 6 according to the present embodiment, the plurality of slits 1c formed in the outer leads 1b and extending lengthwise in the directions in which the outer leads 1b are extracted reduce the rigidity of the outer leads 1b, while dispersing and reducing the lead stress placed in a direction parallel to the directions in which the leads are extracted.

In the MOSFET 6 according to the present embodiment, each of the outer leads 1b has a bent portion 1d formed by bend molding so that the outer leads 1b are formed to have a gull-wing configuration.

This reduces the lead stress placed in a direction parallel to the directions in which the leads are extracted.

Each of the slits 1c is formed in the bent portion 1d to satisfactorily absorb the lead stress in cooperation with the bent portion 1d and thereby reduce the lead stress.

Preferably, each of the slits 1c is formed only in the outer lead 1b. This is because the provision of the slit 1c only in the outer lead 1 extending outwardly from the sidewall of the molding body 3 prevents a resin for molding from flowing into the slit 1c during resin molding. Consequently, the resin for molding is not disposed in the slit 1c so that resin particles are prevented from falling off after the assembly.

As a result, the occurrence of faulty mounting resulting from the resin particles or the like during the mounting of the MOSFET 6 can be reduced and the manufacturing cost for the MOSFET 6 can be reduced, while mounting reliability is prevented from deteriorating.

In the MOSFET 6 according to the present embodiment, a MOS-C chip 7, a FET chips 2, and a transmission line substrate 8 are mounted on the upper surface 5a of the heat sink 5.

Of those two of the outer leads 1b protruding externally from the molding body 3 and disposed in opposing relation, one of the two outer leads 1 serves as a gate electrode on the input side and the other thereof serves as a drain electrode on the output side, while the heat sink 5 serves as a source electrode at the GND potential. At the time of mounting the MOSFET 6, the back surface 5b of the heat sink 5 is GND connected to a radiator 9 or the like via a solder 11, as shown in FIG. 4.

In the molding body 3, the gate-side inner lead 1a is connected electrically to the MOS-C chip 7 by the wire 4. The MOS-C chip 7 is also connected electrically to the FET chip 2 by the wire 4. The FET chip 2 is further connected electrically to the transmission line substrate 8 by the wire 4, while the transmission line substrate 8 is also connected electrically to the drain-side inner lead 1a by the wire 4.

Consequently, an input-side (gate-side) matching circuit is formed at the MOS-C chip 7, while an output-side (drain-side) matching circuit is formed at the transmission line substrate 8 also in consideration of an impedance loss.

As shown in FIGS. 5 and 6, the transmission line substrate 8 uses a high-dielectric-constant ceramic substrate 8c as a base. An Al (aluminum) electrode 8a having a large area is formed on a surface of the transmission line substrate 8, while a GND terminal 8b composed of AuSn or the like is formed on the other surface thereof, so that a microstrip line structure is provided.

The dielectric constant of the transmission line substrate 8 is, e.g., $\in=38$ or $\in=140$.

The heat sink 5 is composed of a copper alloy containing, e.g., molybdenum or tungsten.

The molding body 3 is formed by using a resin for molding which allows resin molding such as an epoxy resin. The dielectric constant of the molding body 3 is on the order of, e.g., $\in=4$.

A description will be given next to a mounted structure of the MOSFET 6 according to the present embodiment.

FIGS. 3 and 4 shows the state of the MOSFET 6 according to the present embodiment which is mounted on a mounting substrate 10 such as a printed circuit board. If the MOSFET 6 is mounted at a base station for a mobile phone or the like, the heat sink 5 of the MOSFET 6 is connected to the radiator 9 of an amplifier at the base station through solder 11, and the gate-side and drain-side outer leads 1b are connected to wires 10a composed of a copper foil or the like of the mounting substrate 10 disposed on the radiator 8 by using a solder 12.

It is to be noted that a strip line is formed of the wire 10a of the mounting substrate 10 which is connected to the outer leads 1b of the MOSFET 6.

The heat sink 5 may also be fixed by screwing to the radiator 9. In addition to the MOSFET 6, an electronic component such as a chip capacitor 13 is also mounted on the mounting substrate 10, as shown in FIG. 3.

During the mounting of the MOSFET 6 on the mounting substrate 10, thermal stress resulting from soldering is applied and thermal stress resulting from an ON/OFF operation and a temperature change is further applied in an actual situation in which the MOSFET 6 is mounted at the base station. In the MOSFET 6 according to the present embodiment, the wide outer leads 1b are formed with the plurality of lengthwise slits 1c extending in parallel to the directions in which the outer leads 1b are extracted. This achieves a reduction in the area of each of the outer leads 1b and thereby achieves a reduction in the rigidity thereof, while allowing the dispersion and reduction of the thermal stress on the lead (lead stress).

Since the outer leads 1b are formed with the respective bent portion 1d to have a gull-wing configuration and the slits 1c are formed in the bent portions 1d, the bent portions 1d are warped to absorb the lead stress irrespective of the outer leads 1b large in width.

As a result, it becomes possible to reduce the lead stress and thereby reduce broken wires and the like in the MOSFET 6 so that the reliability of the MOSFET 6 is enhanced.

In the MOSFET 6 according to the present embodiment, the adjacent ones of a plurality of outer-lead split portions 1f separated by the slits 1c are connected to each other at the respective tip portions thereof, as shown in FIG. 1.

In other words, the plurality of outer-lead split portions 1f of each of the outer leads 1b separated by the slits 1c have respective tip portions connected to each other. The arrangement allows the outer-lead split portions 1f to retain a configuration as the integral outer lead 1b without falling apart so that the lowering of coplanarity (variations in the heights of the tips of the leads) is prevented.

As a result, the coplanarity is prevented from deteriorating in inter-step conveyance in the assembly of the package or the like and a high-accuracy coplanarity requirement in the case of mounting at a base station for a mobile phone or the like is also satisfied.

Since the MOSFET 6 according to the present embodiment is mounted in most cases at a base station for a mobile phone or the like, it is used primarily in the band of 0.8 to 2 GHz. When the MOSFET 6 is used in the band, there are cases where a high-output characteristic on the level of 250 W (watt) is required. To provide the high-output characteristic, a semiconductor chip which allows a large current to flow therethrough becomes necessary. Accordingly, the capacitance of the chip portion is increased and a low impedance characteristic is provided. For the applications of the MOSFET 6 at frequencies in the 1.5 GHz band or higher, an internal matching circuit for increasing the impedance of the lead terminal becomes necessary.

In an actual matching circuit, a capacitance is formed by using the wires 4, the aluminum (Al) electrode or the Au electrode via an oxide film on the semiconductor chip or the matching circuit is formed by using a strip line substrate (transmission line substrate 8) and the electrode capacitance of the package. In the MOSFET 6 according to the present embodiment, the electrode capacitance of the package is formed by using the gap between the inner leads 1a and the heat sink 5.

Specifically, in the MOSFET 6 according to the present embodiment, the heat sink 5 as the metal plate and each of the inner leads 1a have an overlapping portion therebetween, as shown in the enlarged view of FIG. 2, so that an electrostatic capacitance is formed in the region sandwiched therebetween. Since the MOSFET 6 according to the present embodiment uses a package of resin-molded type obtained by resin molding, a resin for molding enters the region sandwiched between the heat sink 5 and the inner lead 1a during resin molding. That is, an insulator composed of the molding body 3 is disposed in the region sandwiched between the heat sink 5 and the inner lead 1a and the electrostatic capacitance is formed by using the molding body 3 as an insulator (dielectric).

The dielectric constant ($\in$) of a ceramic is, e.g., about 10, while the dielectric constant ($\in$) of a resin for molding is about 4. To form a package capacitance equivalent to that of a ceramic package by using a resin-molded package, as in the MOSFET 6 according to the present embodiment, the space between the inner leads 1a and the heat sink 5 should be reduced to about 40% the space therebetween in a ceramic package or the area of each of the inner leads 1a should be increased to about 2.5 times the area thereof in a ceramic package.

Therefore, it is preferable in the MOSFET 6 according to the present embodiment to provide the wire bonded region of the inner lead 1a with an effective region as large as possible (region unformed with a bore). Thus, the MOSFET 6 retains a sufficient electrostatic capacitance required by not providing the slit 1c in the wire bonded region of the inner lead 1a.

A description will be given next to a method for forming a space between the heat sink 5 and the inner leads 1a in the MOSFET 6 according to the present embodiment.

To form a capacitance in the MOSFET 6, it is necessary to provide a space between the inner leads 1a and the heat sink 5.

To satisfy the necessity, the MOSFET 6 according to the present embodiment has depressed portions 5c provided in the two opposing edge portions of the upper surface 5a of the heat sink 5 to be lower in level than the upper surface 5 and one end of each of the inner leads 1a is disposed above either of the depressed portions 5c at a specified distance therefrom, as shown in FIG. 2.

By thus forming the depressed portions 5c lower in level than the upper surface 5a of the heat sink 5 in the overlapping portions between the heat sink 5 and the inner leads 1a, a desired spaced is formed between the heat sink 5 and the inner leads 1a.

In the assembly of the MOSFET 6, the metal plate suspending portions 1e of the lead frame 1 disposed to be flush with the inner leads 1a at the stage of the lead frame 1 have been bonded to the upper surface 5a of the heat sink 5 such that the metal plate suspending portions 1e supporting the heat sink 5 are disposed flush with each of the inner leads 1a after the MOSFET 6 is assembled, as shown in FIG. 31.

Since bend molding has not been performed with respect to each of the inner leads 1a and each of the metal plate suspending portions 1e in the MOSFET 6 according to the present embodiment, the inner lead 1a and the metal plate suspending portion 1e are disposed flush with each other so that a space corresponding to the depth of the depressed portion 5c is formed between each of the inner leads 1a and the heat sink 5.

By contrast, FIG. 32 shows a structure of the MOSFET according to a variation in which a spacer member 18 is interposed between the heat sink 5 and the metal plate suspending portions 1e to form a space corresponding to the thickness of the spacer member 18 between the heat sink 5 and each of the inner leads 1a.

In the MOSFET 6 according to another variation shown in FIG. 33, a desired space has been formed between the heat sink 5 and the inner leads 1a by performing bend molding with respect to the metal plate suspending portions 1e.

In the structure using the spacer member 18 according to the variation shown in FIG. 32, the top and back surfaces of the spacer member 18 provide connections between the metal plate suspending portions 1e and the heat sink 5. In that case, since the connections are provided by, e.g., silver blazing, a tolerance for the distance between the heat sink 5 and each of the metal plate suspending portions 1e is increased. As a result, the distance between the heat sink 5 and the metal plate suspending portion 1e is greatly influenced by a tolerance for the thicknesses of a silver braze at the respective two portions of the top and bottom surfaces of the spacer member 18 and also influenced by a tolerance for the thickness of the spacer member 18.

In the structure of the MOSFET 6 according to the present embodiment shown in FIG. 31, connections are provided directly between the heat sink 5 and the metal plate suspending portions 2e by silver brazing or the like. In this case, silver brazing is performed at one portion relative to the direction of thickness of the package and the spacer member 18 is not interposed so that variations in the distance between each of the metal plate suspending portions 1e and the heat sink 5 are extremely reduced compared with the case of using the structure employing the spacer member 18 shown in FIG. 32.

A description will be given herein to the influence of variations in the distance between the metal plate suspending portions 1e and the heat sink 5 in the MOSFET 6.

FIGS. 26 and 27 show the states of a resin burr 14 produced during resin molding. In the MOSFET 6 according to the present embodiment, variations in the distance between the metal plate suspending portions 1e and the heat sink 5 affects an amount of the resin burr 14 produced.

Specifically, as shown in FIG. 28, when the lead frame 1 and the heat sink 5 are clamped with upper and lower dies 15 and 16 of a molding die in the resin molding step, the back surface 1g of each of the outer leads 1b and the back surface 5b of the heat sink 5 should be clamped together by the clamping surface 16a of the lower die 16 by using the clamping surface 15a of the upper die 15 as a mold reference (P). At this time, if a space is formed between the clamping surface 16a and the back surface 1g of the outer lead 1b or between a cavity surface 16b and the back sur ace 5b of the heat sink 5, the rosin burr 14 on the surface the outer lead or the resin burr 14 on the back surface of the heat sink shown in FIGS. 26 and 27 illustrating the comparative examples occur. The resin burr 14 is a thin-film burr on the micron order.

To prevent the formation of a gap between the clamping surface 16a of the lower die 16 and the back surface 1g of the outer lead 1b and between the cavity surface 16b and the back surface 5b of the heat sink 5, it is necessary to crush, under pressure, each of the outer leads 1b and the heat sink 5 by a thickness of several to several tens of micrometers during die clamping. If the thickness of each of the outer leads 1b and the thickness of the heat sink 5 are represented by (T) and (L), respectively, a distance BL on the die corresponding to the distance between the mold reference (P) and the back surface 1g of the outer lead 1b should be set to a value slightly smaller than (T). On the other hand, a distance BH on the die corresponding to the distance between the mold reference (P) and the back surface 5b of the heat sink 5 should be set to a value slightly smaller than (T+L).

In the context of the foregoing relations, variations in the distance between each of the metal plate suspending portions 1e and the heat sink 5 greatly influence the respective values of the distances BL and BH. This leads to a trade-off between the occurrence of the resin burr 14 on the leads and the occurrence of the resin burr 14 on the heat sink so that the resin burr 14 occurs on either of the leads and the heat sink.

Since a structure in which the depressed portions 5c are formed in the upper surface 5a of the heat sink 5 and each of the metal plate suspending portions 1e and the heat sink 5 are directly bonded by silver brazing or the like, as used in the MOSFET 6 according to the present embodiment shown in FIG. 31, can reduce variations in the distance between the metal plate suspending portion 1e and the heat sink 5, the occurrence of the resin burr 14 shown in FIG. 26 can be reduced and therefore the MOSFET 6 can be manufactured at low cost.

Since the occurrence of the resin burr 14 can be reduced, faulty mounting of the MOSFET 6 resulting from the resin burr 14 can be reduced during the mounting of the MOSFET 6 so that the reliability of the MOSFET 6 is enhanced.

Since bend molding has been performed with respect to the metal plate suspending portions 1e in the MOSFET 6 according to the variation shown in FIG. 33, a level difference is produced between portions sandwiching the clamping portion 15b of the upper die 15 for pressing the heat sink 5 shown in FIG. 28 and the metal plate suspending portion 14, so that the potential of the occurrence of the resin burr 14 is increased.

Accordingly, it is preferable to use a structure in which the metal plate suspending portions 1e and the heat sink 5 are bonded directly by silver brazing or the like, while a desired space is formed between the inner leads 1a and the heat sink 5 through the formation of the depressed portions 5c in the edge portions of the upper surface 5a of the heat sink 5, as used in the MOSFET 6 according to the present embodiment shown in FIG. 31.

Even in a structure in which the spacer member 18 is interposed as shown in FIG. 32 illustrating the variation or in a structure in which bend molding is performed with respect to the metal plate suspending portions 1e shown in FIG. 33 illustrating the variation, it is possible to achieve the same effect of reducing the lead stress and thereby enhancing the reliability of the MOSFET 6 as achieved by the MOSFET 6 shown in FIG. 31 by providing the slits 1c in the outer leads 1b or by providing the outer leads 1b with the bent portions 1d and the slits 1c.

Compared with a conventional ceramic package, the MOSFET 6 shown in each of FIGS. 1, 2, and 31 allows a reduction in package cost because it is of resin-molded type, smaller in the number of silver blazed portions, and capable of scaling down the heat sink 5 which is high in material cost due to the structure thereof which does not bond the leads to a ceramic plate by silver brazing.

Since the MOSFET 6 is of resin molded type, a sealing test and a foreign substance test that have been performed for a conventional ceramic package need not be performed so that assembly cost for the MOSFET 6 is reduced.

A description will be given next to a method for manufacturing the MOSFET 6 according to the present embodiment.

First, the heat sink 5 shown in each of FIGS. 7 to 9 is prepared.

The upper surface 5a of the heat sink 5 has the depressed portions 5c formed in the two edge portions opposing lengthwise thereof. The heat sink 5 is preferably composed of a metal material having a thermal expansion coefficient close to that of silicon (Si) and excellent in heat dissipation such as, e.g., a copper-tungsten alloy or a copper-molybdenum alloy, which is formed by cutting or pressing. The heat sink 5 has a surface plated with nickel.

Then, the lead frame 1 shown in each of FIGS. 10 to 12 is prepared.

The lead frame 1 has the plurality of inner leads 1a and outer leads 1b, the two metal plate suspending portions 1e, and a frame portion 1h for the coupling of these.

The lead frame 1 prepared herein has the plurality of slits 1c formed preliminarily in the outer leads 1b. As shown in FIGS. 11 and 12, the lead frame 1 has a flat plate-like configuration formed with no bent portion.

The lead frame 1 is formed by etching or pressing of a material having a thermal expansion coefficient close to that of the heat sink 5, such as an alloy containing kovar or an iron-nickel alloy. The lead frame 1 has a surface plated with, e.g., nickel.

Thereafter, the lead frame 1 and the heat sink 5 are bonded to each other to form a stem structure shown in each of FIGS. 13 to 15, At that time, the metal plate suspending portions 1e of the lead frame 1 and the upper surface 5a of the heat sink 5 are bonded by silver brazing. As underlying plating, nickel plating is further performed, while gold plating is performed as surface plating.

Then, die bonding which is the mounting of the chips on the heat sink 5 shown in FIG. 16 is performed.

Here, heating is performed at, e.g., about 430° C. and the MOS-C chip 7 and the FET chip 2 are connected to the upper surface 5a of the heat sink 5 by using an AuSi eutectic.

Thereafter, the mounting of the transmission line substrate 8 shown in FIG. 17 is performed.

Here, heating is performed at, e.g., about 330° C. and the transmission line substrate 8 is connected to the upper surface 5a of the heat sink 5 with the application of AuSn.

Thereafter, wire bonding shown in FIG. 18 is performed.

For example, wire bonding is performed by ultrasonic bonding at a room temperature using the aluminum wires 4. At that time, the inner leads 1a and the MOS-C chip 7 are connected by the wires 4, the MOS-C chip 7 and the FET chip 2 are connected by the wires 4, the FET chip 2 and the transmission line substrate 8 are connected by the wires 4, and the transmission line substrate 8 and the inner leads 1a are further connected by the wires 4.

Subsequently, the connecting state of the wires 4 and the like are examined by using a stereoscopic microscope.

Then, as shown in FIG. 19, resin molding is performed by transfer mold by using an epoxy resin having a dielectric constant on the order of, e.g., $\in=4$, thereby forming the molding body 3.

At this time, since the lead frame 1 is flat and the metal plate suspending portions 1e and the heat sink 5 are bonded directly to each other by silver brazing or the like, variations in the distance between each of the metal plate suspending portions 1e and the heat sink 5 can be reduced so that the occurrence of the resin burr 14 shown in FIG. 26 is reduced.

Then, marking is performed by using a laser or the like, thereby making marks 17 including a product model number and a lot number on the surface of the molding body 3 shown in FIG. 22.

Thereafter, lead cutting is performed as shown in FIGS. 20 and 21.

Here, the frame portion 1h of the lead frame 1 is cut and then the outer leads 1b and the metal plate suspending portions 1e are separated from the frame portion 1h.

Thereafter, the MOSFET 6 is attached onto a measuring substrate 19 as shown in each of FIGS. 29 and 30 so that a characteristic screening test is performed on the MOSFET 6.

On the measuring substrate 19, a GND pattern 19a, an input signal pattern 19b, and an output signal pattern 19c are formed. The GND pattern 19a is GND connected to the radiator 9 disposed on the back surface of the substrate via through holes 19d.

Electronic components such as a chip resistor 23, a ceramic capacitor 24, an electrolytic capacitor 25, a feed-through capacitor 26, and an air trimmer capacitor 27 are also mounted on the measuring substrate 19. The input signal pattern 19b is connected to an RF input connector 20 via a coaxial cable 21, while the output signal pattern 19c is connected to an output connector 22 via the coaxial cable 21.

On the gate side, the input signal pattern 19b is connected to a gate bias (VGG) power source E via the chip capacitor 13, the air trimmer capacitor 27, the chip resistor 23, the feed-through capacitor 26, and the like. On the drain side, the output signal pattern 19c is connected to a drain bias (VDD) power source F via the chip capacitor 13, the air trimmer capacitor 27, the feed-through capacitor 26, and the like.

To the measuring substrate 19, the MOSFET 6 is attached to provide electrical connections between the gate-side outer leads 1b and the input signal pattern 19b and between the drain-side outer leads 1b and the output signal pattern 19c so that the characteristic screening test is performed.

At that time, each of the outer leads 1b is pressed by using a pressing plate 28 via a lead pressing member 29, as shown in FIG. 30, to keep the individual outer leads 1b in contact with the input signal pattern 19b and the output signal pattern 19c. The pressing plate 28 is composed of, e.g., an acrylic resin or the like and the lead pressing member 29 is composed of, e.g., silicone rubber or the like.

Since the plurality of lengthwise slits 1c are formed in the respective outer leas 1b in the MOSFET 6 according to the present embodiment, the rigidity of each of the outer leads 1b has been reduced. This reduces lead stress on each of the outer leads 1b when pressed with the lead pressing member 29 and enhances the degrees of intimate contact between the outer leads 1b and the input signal pattern 19b and between the outer leads 1b and the output signal pattern 19c.

As a result, measurement accuracy can be improved.

Since each of the outer leads 1b is flat and formed with no bent portion at the stage of the characteristic screening test, the contact between the outer leads 1b and the input signal pattern 19b and between the outer leads 1b and the output signal pattern 19c can be improved so that measurement errors are reduced.

After the characteristic screening test, the individual outer leads 1b are bend molded into a gull-wing configuration formed with the bent portions 1d, as shown in FIGS. 22 and 23, while the metal plate suspending portions 1e are cut and separated, whereby the assembly of the MOSFET 6 is completed, as shown in FIGS. 24 and 25.

Although the invention achieved by the present inventor has been described specifically with reference to the embodiments thereof, the present invention is not limited thereto. It will be understood that various changes and modifications can be made in the invention without departing from the gist thereof.

For example, each of the foregoing embodiments has described the case where the MOSFET 6 is assembled by preparing the lead frame 1 having the outer leads 1b formed preliminarily with the respective slits 1c, but it is sufficient for the slits 1c to be formed at least before the characteristic screening test. During the characteristic screening test, the slits 1cformed achieve the effect of reducing the lead stress.

By forming the slits 1b at least before forming the bent portions 1d, the rigidity of each of the outer leads 1b is reduced so that easy bending of each of the leads is performed during the bend molding of the outer leads 1b.

The slits 1c of the outer leads 1b are formed preferably during the formation of the lead frame 1.

The following is the brief description of effects achievable by the representative aspects of the invention disclosed in the present application.

Since the slits are formed in the respective portions of the plurality of leads located outside the molding body to extend lengthwise in the directions in which the leads are extracted, the rigidity of the leads is reduced and lead stress which are stresses placed on the leads can be reduced. This enhances the reliability of the semiconductor device.

What is claimed is:

1. A semiconductor device comprising:

a metal plate for mounting a semiconductor chip;

a plurality of leads connected electrically to said semiconductor chip; and a molding body for molding said semiconductor chip and a part of each of said plurality of leads, wherein a slit, extending lengthwise in a direction in which said lead is extracted, is formed in each of raid leads located outside said molding body.

2. A semiconductor device according to claim 1, wherein each of said leads is comprised of an inner lead and an outer lead, and said slit is formed only in said outer lead.

3. A semiconductor device according to claim 1, wherein each of said leads is comprised of an inner lead and an outer lead, and the outer lead of said lead is formed with a bent portion.

4. A semiconductor device according to claim 3, wherein said slit is formed in said bent portion.

5. A semiconductor device according to claim 1, wherein said metal plate is a heat sink.

6. A semiconductor device according to claim 1, wherein said molding body is formed of a resin for molding.

7. A semiconductor device according to claim 1, wherein each of said leads is comprised of an inner lead and an outer lead, and those of a plurality of outer-lead split portions separated by said slits which are adjacent to each other are connected at respective tip portions thereof.

8. A semiconductor device according to claim 1, wherein an electrode of said semiconductor chip and each of said leads are electrically connected to each other by a metal wire.

9. A semiconductor device according to claim 1, wherein said metal plate and each of said leads have an overlapping portion therebetween.

10. A semiconductor device according to claim 1, wherein an output of said semiconductor chip is 30 watt or more.

11. A semiconductor device according to claim 1, wherein said semiconductor chip includes a MISFEET and one of those two of said leads disposed in opposing relation is a gate electrode of said MISFET, while the other of those two of said leads is a drain electrode of said MISFET.

12. A semiconductor device comprising:

a metal plate for mounting a semiconductor chip;

a plurality of leads each having an inner lead connected electrically to said semiconductor chip and an outer lead connecting to the inner lead and formed with a bent portion; and a molding body for molding said semiconductor chip and a part of each of said plurality of leads, said molding body being formed of a resin for molding, wherein a slit, extending lengthwise in a direction in which said lead is extracted, is formed in each of said leads located outside said molding body, and wherein said slit is formed in said bent portion, and those of a plurality of outer-lead split portions separated by said slits which are adjacent to each other are collected at respective tip portions thereof.

13. A semiconductor device comprising:

a metal plate for mounting a semiconductor chip, said metal plate having an edge portion formed with a depressed portion;

a plurality of leads connected electrically to said semiconductor chip, and a molding body for molding said semiconductor chip and a part of each of said plurality of leads, wherein each of said plurality of leads is comprised of an inner lead portion and an outer lead portion;

the inner lead portion is positioned inside the molding body;

the outer lead portion is positioned outside the molding body;

the depressed portion of the metal plate is positioned inside the melding body; and p1 the inner lead portion is positioned over the depressed portion of the petal plate.

14. A semiconductor device according to claim 13, wherein an insulator is disposed between each of said plurality of leads and said metal plate.

15. A semiconductor device according to claim 14, wherein said insulator is said molding body.

16. A semiconductor device according to claim 13, wherein said plurality of leads have respective inner leads disposed to be flush with a metal plate suspending portion for supporting said metal plate.

* * * * *